United States Patent [19]

Juchmann

[11] 3,940,787

[45] Feb. 24, 1976

[54] MOUNTING FOR LOCKING DISC SHAPED SEMICONDUCTOR ELEMENT IN A HOUSING

[75] Inventor: Heinz Juchmann, Belecke, Germany

[73] Assignee: Licentia Patent-Verwaltungs-G.m.b.H., Frankfurt am Main, Germany

[22] Filed: June 19, 1974

[21] Appl. No.: 480,847

[30] Foreign Application Priority Data

June 28, 1973  Germany.............................. 2332896

[52] U.S. Cl. ..................... 357/75; 357/74; 357/76; 357/79; 357/81; 174/52 S
[51] Int. Cl.² ........................................ H01L 23/16
[58] Field of Search ............ 357/74, 75, 76, 79, 81; 174/52 S

[56] References Cited
UNITED STATES PATENTS

| | | | |
|---|---|---|---|
| 3,553,538 | 1/1971 | Bezouska.............................. | 357/79 |
| 3,654,529 | 4/1972 | Lord .................................... | 357/79 |
| 3,688,163 | 8/1972 | Daniels................................. | 357/79 |
| 3,721,867 | 3/1973 | Schierz ................................. | 357/79 |
| 3,736,474 | 5/1973 | Sias...................................... | 357/79 |

*Primary Examiner*—Andrew J. James
*Attorney, Agent, or Firm*—Spencer & Kaye

[57] ABSTRACT

An assembly composed of a disc-shaped semiconductor component mounted on a support disc and disposed in an annular ceramic housing, with the support disc resting on a first contacting disc, a second contacting disc resting on the component, and an insulating centering ring encircling the discs to center the component relative to the contacting discs, the assembly further including a first supporting ring soldered to the first contacting disc and resting on an internal flange at one end of the housing, a second supporting ring having a toothed outer periphery and an outer diameter larger than the diameter of the interior of the housing and soldered to the second contacting disc, the second ring being press fitted into the housing so as to be flexed in a direction to press the second contacting disc against the semiconductor component, and a cast mass of elastic material filling the interior of the housing to fasten the semiconductor component and the discs to the housing.

5 Claims, 3 Drawing Figures

3,940,787

MOUNTING FOR LOCKING DISC SHAPED SEMICONDUCTOR ELEMENT IN A HOUSING

BACKGROUND OF THE INVENTION

The present invention relates to semiconductor rectifier structures, particularly for high current applications.

The present invention is more specifically directed to semiconductor arrangements of the type composed of a disc-shaped semiconductor device containing a ceramic ring, the arrangement including a carrier disc having the disc-shaped semiconductor device fastened thereto and at least one contact electrode fastened to the free disc surface of the semiconductor device with the arrangement being fastened in the housing with the aid of a centering device.

A corresponding semiconductor device is disclosed in German Pat. No. 2,021,158 and in my corresponding U.S. Pat. No. 3,673,308, in which two circular, disc-shaped, membrane-like contacting sheets, which are fastened together at their edges by the ceramic ring, serve as contacting devices for the semiconductor device and in which the semiconductor device is centered and fixed in the ceramic ring with the aid of a flat, spreadable insulating locking ring.

This insulating locking ring is made of woven silicone hard glass and is provided at its inner and outer edge surfaces with three protrusions which are at a 60° angular offset from one another and have frontal or edge faces which are adapted to the wall surfaces of the carrier disc of the semiconductor device or the inner wall surfaces of the ceramic ring.

For this adaption of the insulating locking ring to the wall surface of the carrier disc and to the inner wall surface of the ceramic ring use is made of the known three-point bearing and, with a slight degree of overdimensioning of the outer diameter and a slight degree of underdimensioning of the inner diameter of the locking ring without tension, it is possible to obtain perfect centering of the semiconductor device in the ceramic ring which serves as the housing. Such a semiconductor arrangement is relocatable and can be clamped into a pressure contacting device as often as desired, with the semiconductor device always being brought into contact with the contacting sheets under pressure via the same microcontact points.

SUMMARY OF THE INVENTION

It is an object of the present invention to provide a semiconductor arrangement which cannot be relocated, particularly for rectifier diodes and thyristors of the higher current types, and which can be manufactured at low cost.

Applicant has discovered that these and other objects of the invention can be achieved by employing the following features.

An arrangement including two contacting discs with the same diameter and semiconductor device is centered by means of an insulating ring provided with an opening and having an inner diameter adapted to the diameter of the discs; and is supported by a supporting ring of sheet metal which is hard-soldered, or brazed, to the wall surface of one contacting disc, the insulating ring being placed on the supporting ring and being positioned, by means of this supporting ring, on an internal flange formed at one frontal face of an annular housing;

the second contacting disc is pressed against the semiconductor device and supported at an inner wall of the housing by a second supporting ring of sheet metal which is brazed via its inner edge surface to the wall of the second contacting disc, the outer edge of the second ring having a tooth-shaped configuration and having an outer diameter which is greater than the innner diameter of the annular housing; and the centered arrangement of the contacting discs and the semiconductor device is connected with the annular housing by means of an elastic cast, or poured, mass.

A further embodiment of the invention relates to a semiconductor arrangement including a disc-shaped semiconductor device provided with an annular cathode and a central electrode both disposed on the free surface of the disc, the annular cathode having a radial slit and the central electrode being electrically insulated from the cathode, there also being a connecting lead passing through the radial slit and connected to the central electrode. In such embodiment, the arrangement is provided with a contacting disc for the cathode, which contacting disc has at its center a recess in which a pressure contacting device for the central electrode is disposed, while an insulating disc and a contacting disc to which a connecting lead is connected are disposed between the pressure contacting device and the central electrode, the insulating disc and the contacting disc being inserted into the annular cathode.

According to a further embodiment of the invention a ring of ceramic material, which encloses the contacting disc and which ends at the flangeless frontal face of the ceramic ring, is placed into the cast mass.

A semiconductor arrangement according to the invention can be produced at low cost and is easily constructed and assembled. Use may be made of an insulating ring of an inexpensive ceramic material which is dimensioned to end at the flangeless frontal face of the ceramic housing. Such an arrangement can be locked to the ceramic housing by a mechanical bias provided by the supporting ring whose outer edge surface has a toothed shape and which provides a force locking relationship with the inner wall of the ceramic housing so as to be self-supporting.

DESCRIPTION OF THE PREFERRED EMBODIMENTS

Figure 1:
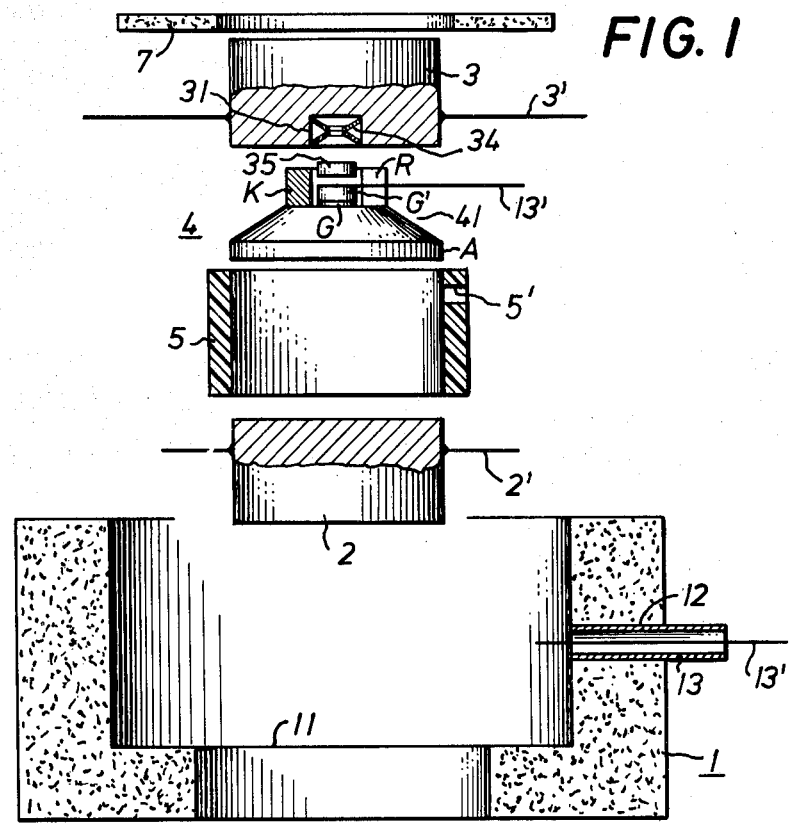
FIG. 1 is an exploded cross-sectional view of a semiconductor arrangement according to a preferred embodiment of the invention.

A semiconductor arrangement according to the invention includes, as shown in FIG. 1, an annular housing 1 of ceramic material, a contacting disc 2, a centering insulating ring 5, a semiconductor device 4, a second contacting disc 3 and a ceramic ring 7. Housing 1 is provided at its one frontal face with an internal flange 11 and in its lateral wall with channel 12 in which is inserted a tube 13 enclosing a connecting lead 13'. The contacting disc 2 has a diameter (the horizontal dimension in the drawing) which is smaller than the inner diameter of the internal flange 11. A supporting ring 2' of deep-drawn iron sheet or copper sheet is hard-soldered, or brazed, to the jacket surface of disc 2 along its inner edge surface. The outer diameter of this supporting ring is greater than the inner diameter of the internal flange 11.

The semiconductor device 4 is an arrangement with an operable thyristor wafer 41 which is attached to a support disc A serving as the anode and is provided at its exposed disc surface with an annular contact electrode K serving as the cathode and with a central electrode G serving as the control electrode. The connecting lead 13' is hard-soldered to a contacting disc G' of the central electrode.

The contacting disc 3 has the same diameter as the disc 2. A supporting ring 3', again of deep-drawn iron sheet or copper sheet, is hard-soldered along its inner edge surface to the jacket surface of the disc 3. The outer periphery of the supporting ring 3' has a toothed shape. The outer diameter of the supporting ring is greater than the inner diameter of the ceramic housing 1.

The disc 3 has, at its flat side facing the semiconductor device 4, a recess 31 in the center of which a contact pressure device 34 for the central electrode G is disposed. The contact pressure device includes a set of spring discs.

The annular electrode K has a radial slit R through which the connecting lead 13' is brought to contacting disc G' of central electrode G. Between the contact pressure device 34 and the contacting disc G' there is disposed an insulating disc 35 which is inserted into the annular contact electrode K.

The ceramic insulating ring 7 has an inner diameter which is greater than the diameter of the contacting disc 3 and an outer diameter which is smaller than the inner diameter of the ceramic housing 1. The insulating ring 5 serves to center the arrangement 2, 4, 3 and has an inner diameter which is adapted to the diameter of the discs 2 and 3 and a ring height which is less than the spacing between the supporting rings 2' and 3' once the arrangement is assembled. The insulating ring 5 is further provided with an opening 5' for the connecting lead 13' of the contacting disc G' of the central electrode G.

Figure 2:
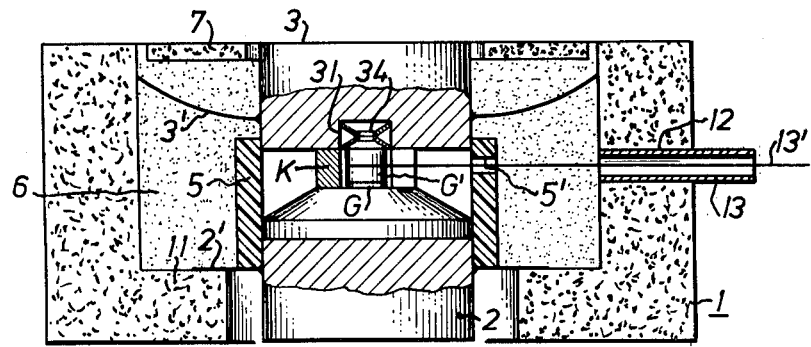
FIG. 2 is a cross-sectional view of the semiconductor arrangement of FIG. 1 in the assembled state.

The construction of the semiconductor arrangement as a whole and the individual steps in assembling it can be seen when FIGS. 1 and 2 are compared.

First, the contacting disc 2 with the supporting ring 2' soldered thereto is inserted from the top into the ceramic housing 1 and is placed approximately in the center of the annular housing 1 so that the supporting ring 2' rests on the internal flange 11. Then the insulating ring 5 is placed from the top over disc 2 and pushed onto the supporting ring 2'. Then the assembled semiconductor device 4, in this embodiment a thyristor, is inserted into the insulating ring 5 from the top and is placed onto disc 2. The radial slit R and the opening 5' in insulating ring 5 are aligned to be flush with the channel 12 in the ceramic housing 1 so that the connecting lead 13', which is hard-soldered to the contacting disc G', can be passed through the radial slit R, the opening 5' and the tube 13 in the ceramic housing 1 to lead out of the total arrangement.

Then the contacting disc 3 together with the soldered-on supporting ring 3' is pressed from the top until contact is made with cathode K of the thyristor. The supporting ring 3' is thus spread upwardly so that the arrangement 2, 4, 3 is connected in a force locking manner with the annular ceramic housing 1. Moreover, the central electrode G is made to contact disc G' under pressure by the contact pressure device 34 through insulating disc 35. Finally the centered arrangement 2, 3, 4 is embedded in an elastic potting mass 6 and thus fastened in ceramic housing 1. A ring 7, also of ceramic, which ends at the flangeless frontal face of the annular ceramic housing, can then also be inserted from the top into the hardening cast mass 6.

The elastic cast mass is a flowable two-part silicone elastomer that develops a strong, self-priming adhesive bond upon heating at 150°C. It is sold under the registered designation "Dow Corning 96-083 Silicond Adhesive". Some pertinent physical properties as well as uses and handling instructions are compiled in the Dow Corning Corporation new product information.

In the semiconductor arrangement of FIG. 1 and FIG. 2 the contacting disk 3 typically has an outer diameter of 30 mm and the interior of housing 1 has a diameter of 40 mm.

Figure 3:
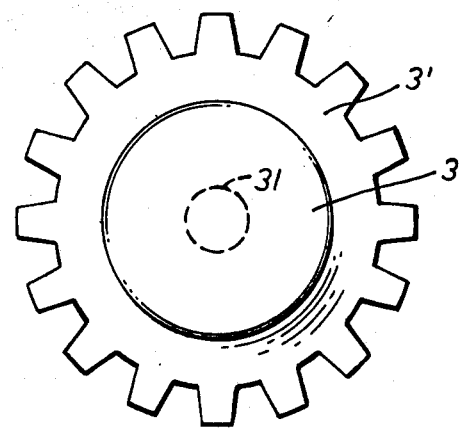
FIG. 3 is an elevation view of the second contacting disk and the second supporting ring of FIG. 1.

Referring to FIG. 3 the sheet metal supporting ring 3', which is hard-soldered along its inner edge surface to the jacket surface of the disk 3, having a tooth-shaped outer edge is shown in the flat state.

It will be understood that the above description of the present invention is susceptible to various modifications, changes and adaptations, and the same are intended to be comprehended within the meaning and range of equivalents of the appended claims.

I claim:

1. In a disc-shaped semiconductor arrangement including: an annular ceramic housing having a hollow cylindrical interior and having an internal flange adjacent one end face thereof; first and second contacting discs having identical diqmeters; a semiconductor element interposed between said contacting discs and including a support disc disposed in the housing to be in contact with said first contacting disc, and having a diameter equal to that of said contacting discs, and a disc-shaped semiconductor body fastened via one of its end surfaces to the support disc and having at least one contact electrode fastened to the other of its end surfaces to be in contact with said second contacting disc; and an electrically insulating centering ring having an inner diameter matching the diameter of said support disc and said contacting discs and provided with a passage for a connecting lead, said centering ring being disposed to center the contacting discs and the semiconductor element in the housing, the improvement wherein said arrangement further comprises:

a first sheet metal supporting ring having its inner edge soldered to the perimeter of said first contacting disc and bearing against said internal flange of said housing, said first ring thereby supporting the unit formed by said contacting discs and said semiconductor element and one end of said centering ring resting on said first ring;

a second sheet metal supporting ring having its inner edge soldered to the perimeter of said second contacting disc and having a tooth-shaped outer edge, the outer diameter of said second ring being greater than the interior diameter of said housing and said second ring being press-fitted into said housing in a manner to cause said second contacting disc to be pressed against said semiconductor body and to be supported by the interior wall surface of said housing; and a mass of elastic cast material filling said housing interior for connecting the unit formed by said contacting discs and said semiconductor element to said housing.

2. An arrangement as defined in claim 1 wherein said other end surface of said semiconductor body is provided with an annular contact electrode having a radial slit and a central electrode enclosed by and insulated from said annular electrode, and said second contacting disc contacts said annular electrode and is provided with a recess in the center of its end face which faces said body, and said arrangement further comprises a contact pressure applying device for said central electrode disposed in said recess, and insulating disc and a central disc and a connecting lead connected to said central disc and extending through said radial slit, said insulating disc and said central contacting disc being disposed between said contact pressure applying device and said central electrode and enclosed by said annular contact electrode, with said central contacting disc conductively contacting said central electrode and said insulating disc being interposed between said contact pressure applying device and said central contacting disc.

3. An arrangement as defined in claim 1 further comprising a ring of ceramic material enclosing said second contacting disc and positioned in said mass of cast material, to be even with the other end face of said ceramic housing, the region of said other end face of said housing being free of any radially inward projection.

4. An arrangement as defined in claim 1 wherein said element is a rectifier diode.

5. An arrangement as defined in claim 1 wherein said element is a thyristor.

\* \* \* \* \*